United States Patent
Angelopoulos et al.

[11] Patent Number: 5,997,773
[45] Date of Patent: *Dec. 7, 1999

[54] METHOD FOR PROVIDING DISCHARGE PROTECTION OR SHIELDING

[75] Inventors: Marie Angelopoulos, Cortlandt Manor; Vlasta A. Brusic, Amawalk; Teresita Ordonez Graham, Irvington; Sampath Purushothaman, Yorktown Heights; Ravi F. Saraf, Briarcliff Manor, all of N.Y.; Jane Margaret Shaw, Ridgefield, Conn.; Judith Marie Roldan, Ossining; Alfred Viehbeck, Fishkill, both of N.Y.

[73] Assignee: International Business Machines Corporation, Armonk, N.Y.

[*] Notice: This patent is subject to a terminal disclaimer.

[21] Appl. No.: 09/249,302

[22] Filed: Feb. 12, 1999

Related U.S. Application Data

[60] Continuation of application No. 08/928,496, Sep. 12, 1997, Pat. No. 5,916,486, which is a division of application No. 08/356,026, Dec. 14, 1994, Pat. No. 5,700,398.

[51] Int. Cl.[6] .................... H01B 1/20; B05D 5/12
[52] U.S. Cl. ................... 252/511; 252/500; 427/58; 427/101
[58] Field of Search .................. 252/500, 510, 252/511, 512; 427/58, 101, 122, 123

[56] References Cited

U.S. PATENT DOCUMENTS

| | | | |
|---|---|---|---|
| 3,060,156 | 10/1962 | Rassweiler et al. | 260/79 |
| 3,616,186 | 10/1971 | Blackwell | 161/187 |
| 3,617,365 | 11/1971 | Fisher | 117/132 |
| 4,064,084 | 12/1977 | Blackwell | 260/29.2 |
| 4,132,823 | 1/1979 | Blackwell et al. | 428/215 |
| 4,145,326 | 3/1979 | Blackwell | 260/29.6 |
| 4,177,320 | 12/1979 | Yoshimura et al. | 428/419 |
| 4,396,658 | 8/1983 | Mettes et al. | 428/36 |
| 4,483,811 | 11/1984 | Hirata | 264/162 |
| 4,618,739 | 10/1986 | Theobald | 174/52 |
| 4,770,067 | 9/1988 | Liu et al. | 76/104 |
| 4,817,264 | 4/1989 | Worthing | 29/512 |
| 4,876,305 | 10/1989 | Mazany | 524/401 |
| 4,920,356 | 4/1990 | Goebel et al. | 346/1.1 |
| 4,929,388 | 5/1990 | Wessling | 252/500 |
| 4,988,755 | 1/1991 | Dickens, Jr. et al. | 524/401 |
| 5,002,818 | 3/1991 | Licari et al. | 428/209 |
| 5,169,892 | 12/1992 | Kawashima et al. | 524/394 |
| 5,177,137 | 1/1993 | Kawashima et al. | 524/413 |
| 5,182,050 | 1/1993 | Joyce, Jr. et al. | 252/500 |
| 5,198,153 | 3/1993 | Angelopoulos et al. | 252/500 |

(List continued on next page.)

FOREIGN PATENT DOCUMENTS

| | | |
|---|---|---|
| 0 181 587 A3 | 5/1986 | European Pat. Off. |
| 0 309 286 A2 | 3/1989 | European Pat. Off. |
| 0 309 286 A3 | 3/1989 | European Pat. Off. |
| 0 403 180 A3 | 12/1990 | European Pat. Off. |
| 0 488 321 A1 | 3/1992 | European Pat. Off. |
| 2679240 A1 | 1/1993 | France. |
| 42 20 411 A1 | 12/1993 | Germany. |

OTHER PUBLICATIONS

Angelopoulos et al., "Polyaniline Solutions, Films and Oxidation State", *Mol. Cryst. Liq. Cryst.*, 1988, vol. 160, pp. 151–163.

Genies, Electroplating Metal Onto Supports Previously Coated with Polymer—esp. Polymers of Pyrrole, Thiophene, Aniline or Benzene, p. substd. French 2649126 (Abstract).

Aeiyach et al., Chemical deposition of thin layer of aniline or aromatic heterocycle polymer—by polymerization on metal substrate using nitric acid, French 2679240 (Abstract).

*Primary Examiner*—Mark Kopec
*Attorney, Agent, or Firm*—Pollock, Vande Sande & Amernick; Daniel P. Morris

[57] ABSTRACT

Electrostatic discharge protection or electromagnetic interference shielding is provided by applying a composition comprising a thermoset or thermoplastic polymeric matrix, and a conductive filler component, where said filler component comprises electrically conductive particles and at least one conducting polymer to a dielectric substrate.

36 Claims, 1 Drawing Sheet

U.S. PATENT DOCUMENTS

| | | | |
|---|---|---|---|
| 5,225,110 | 7/1993 | Kathirgamanathan | 252/512 |
| 5,232,631 | 8/1993 | Cao et al. | 252/500 |
| 5,250,228 | 10/1993 | Baigrie et al. | 252/511 |
| 5,300,208 | 4/1994 | Angelopoulos et al. | 205/50 |
| 5,413,739 | 5/1995 | Coleman | 252/511 |
| 5,427,715 | 6/1995 | Ohwa et al. | 252/500 |
| 5,436,796 | 7/1995 | Abe et al. | 361/525 |
| 5,498,372 | 3/1996 | Hedges | 252/511 |
| 5,654,081 | 8/1997 | Todd | 428/209 |
| 5,714,252 | 2/1998 | Hogerton et al. | 428/344 |

METHOD FOR PROVIDING DISCHARGE PROTECTION OR SHIELDING

This application is a continuation of Ser. No. 08/928,496 (filed Sep. 12, 1997, now U.S. Pat. No. 5,916,486), which application is a division of Ser. No. 08/356,026 (filed Dec. 14, 1994, now U.S. Pat. No. 5,700,398).

TECHNICAL FIELD

The present invention is concerned with polymeric compositions that are electrically conductive. In particular, the compositions of the present invention contain a polymeric matrix and a conductive filler component that includes conductive particles, such as metal particles and certain polymers.

The particular polymers employed, pursuant to the present invention, are the polyanilines, polyparaphenylenevinylenes, polythiophenes, polyfuranes, polypyrroles, polyselenophene, polyparaphenylenes, polyazines, poly-p-phenylene sulfides and polyacetylenes and mixtures thereof and copolymers made from the monomers to form the above polymers. Any of the above polymers can be substituted or unsubstituted.

Compositions of the present invention are especially useful as corrosion protecting layers for metal substrates, for electrostatic discharge protection, electromagnetic interference shielding, and as adhesives for interconnect technology to replace solder interconnections.

According to another aspect of the present invention, substituted and unsubstituted polyanilines are used as corrosion controlling layers for metal substrates.

BACKGROUND OF INVENTION

It has been suggested to convert normally insulating thermoset and thermoplastic polymers or prepolymers into electrically conducting compositions by admixing therewith various electrically conductive metal particles, such as silver and copper. The possible applications for such conducting compositions are quite extensive. For instance, it would be desirable to use these conducting compositions for electrostatic discharge protection, electromagnetic interference shielding, as adhesives for interconnect technology as replacements for solder joint connections.

However, there are problems associated with this technology. Often, high levels of the metal particles are needed to achieve the desired level of electrical conductivity, especially in high current carrying applications, such as interconnect technology, where the higher levels of electrical conductivity must be achieved. A loading level of 50% and higher is often required for such applications. A second serious problem with these metal fillers is that the more useful ones, silver and copper, tend to corrode in a variety of ambients. The metal has a tendency to oxidize, and thus, an oxidized layer of copper or silver will be on the surface of the particles, and will result in loss of conductivity, or at least a decrease in the conductivity.

Although both copper and silver are called "noble," they readily corrode in a variety of ambients. In oxygen saturated deionized water, copper and silver dissolve at a rate of about 0.2 $\mu$m/day, with no evidence of passivation. Both metals are susceptible to the presence of pollutants, notably chlorides and sulphur.

In the presence of humidity, pollutants and an applied electrical field (not an uncommon situation for the electronic parts in operation), copper and silver dissolve from the more positive metallic part and plate at the more negative part as dendrites. The formation of dendrites can result in electrical shorts that can lead to the failure of the electronic device.

Furthermore, with increasing line density and decreasing dimensions, ion accumulation alone, without dendrites, can ruin the designed electrical performance of the product. Use of inhibitors, such as benzotriazole (BTA), greatly improves the corrosion resistance of copper and silver. However, BTA is not very protective against dissolution at potentials above the open circuit potential, as it may occur in a galvanic contact with gold or platinum, or in service, with the applied field.

Moreover, to circumvent these problems, copper and silver metal particles are often coated with other more stable metals, such as gold or nickel. This is done by electroless or electroplating processes, which add additional processing costs and pose potential environmental concerns, due to the chemical make-up of the electroplating baths.

SUMMARY OF INVENTION

The present invention is concerned with a composition that comprises a thermoset or thermoplastic polymeric matrix, and a conductive filler component. The conductive filler component contains conductive particles and certain polymers. The polymer is selected from the group consisting of polyparaphenylenevinylenes, polyanilines, polyazines, polythiophenes, poly-p-phenylene sulfides, polyfuranes, polypyrroles, polyselenophene, polyparaphenylenes, polyacetylenes and mixtures thereof, and copolymers thereof. These polymers can be substituted or unsubstituted. In addition the conductivity of these polymers can be tuned from about $10^{-10}$ ohm$^{-1}$cm$^{-1}$ to about $10^6$ ohm$^{-1}$cm$^{-1}$ by chemical manipulation such as by incorporation of substituents, doping levels and/or processing conditions. These polymers are also referred to hereinafter as "conducting" or "conductive" polymers.

In addition, the present invention is concerned with the use of the above disclosed compositions, as corrosion protecting layers for metal substrates, for electrostatic discharge protection, electromagnetic interference shielding and as adhesives for interconnections as alternatives to solder interconnections. The present invention provides for a simple, relatively inexpensive and environmentally safe method of protecting the metal particles from corrosion, without loss in electrical conductivity. Moreover, the present invention makes it possible to reduce the loading level required for the metal particles.

It has also been found, pursuant to the present invention, that polyanilines and especially alkoxy substituted polyanilines, as such, can be used as corrosion protecting layers for metal substrates.

BEST AND VARIOUS MODES FOR CARRYING OUT INVENTION

Figure 1:
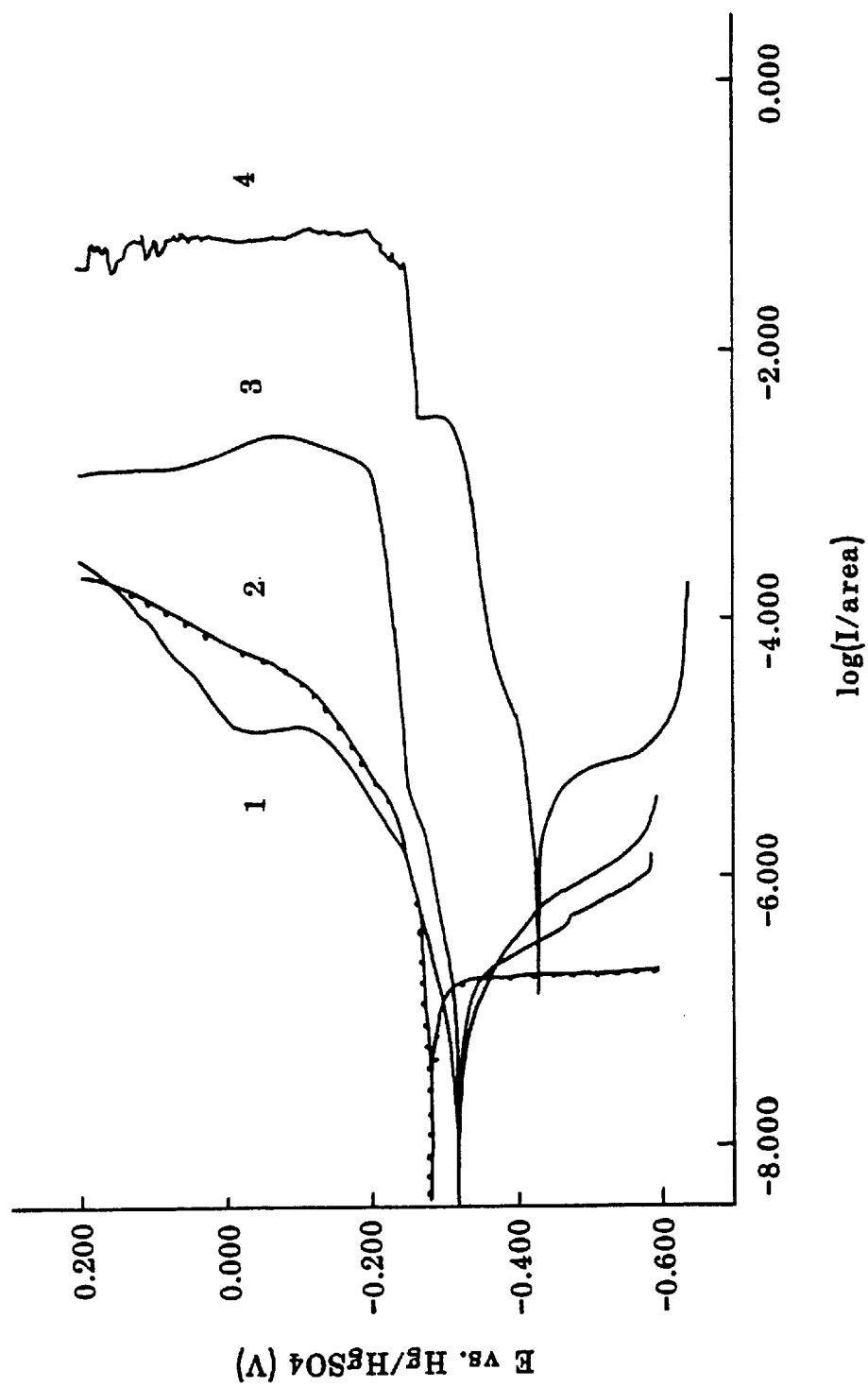
FIG. 1 provides potentiodynamic polarization curves for copper coated with different materials.

The filler component of the compositions of the present invention contain electrically conductive particles, and a certain amount of a conducting polymer. The particles are preferably carbon and metal, such as silver or copper, and in the form of powder, flakes or fibers.

The polymer portion of the filler component is selected from substituted and unsubstituted polyparaphenylenevinylenes, substituted and unsubstituted polyazines substituted and unsubstituted polyanilines, substituted and unsubstituted polythiophenes, substituted and unsubstituted polyfuranes, substituted and unsubstituted polyparaphenylenes, substituted and unsubstituted poly-p-phenylene sulfides, substituted and unsubstituted polypyrroles, substituted and unsubstituted polyselenophene, substituted and unsubstituted polyacetylenes, and combinations thereof and copolymers made from the monomers to form the above polymers. Examples of suitable substitutions include alkyl, aryl, alkoxy aryloxy groups, alkanyl and aralkyl. Typically, such groups contain 1–12 carbon atoms. The substituted polymers are preferred because they exhibit enhanced solubility and processability.

One type of polymer useful to practice the present invention is the conductive form of a substituted or unsubstituted polyaniline having the following general formula:

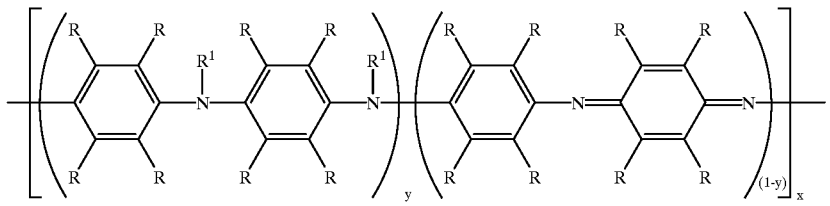

wherein each R can be H or any organic or inorganic radical; each R can be of the same or different; wherein each $R^1$ can be H or any organic or inorganic radical each $R^1$ can be the same or different; X is $\geq 1$ and preferably $X \geq 2$ and y has a value from 0 to 1. Examples of organic radicals are alkyl or aryl radicals. Examples of inorganic radicals are Si and Ge. This list is exemplary only and not limiting. The most preferred embodiment is emeraldine base form of the polyaniline, wherein y has a value of 0.5. In the above equation, the polyaniline is in the non-doped form having a conductivity of about $10^{-10}$ ohm$^{-1}$cm$^{-1}$. The polyaniline can be converted to the conducting form by doping, which involves reacting the polyaniline with a cationic species QA. QA can be, for example, a protic acid, wherein Q is hydrogen The nitrogen atoms of the imine part of the polymer become substituted with the Q cation to form an emeraldine salt, as shown in the following equation:

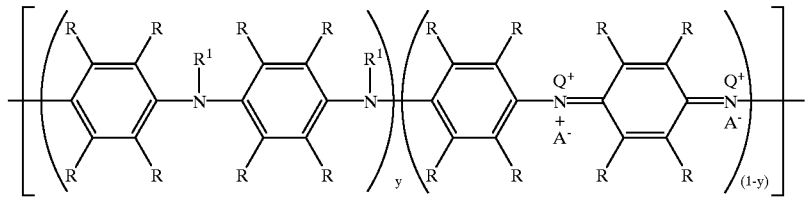

The emeraldine salt is the highly conducting form. The conductivity of the polyaniline can range from $10^{-10}$ ohm$^{-1}$cm$^{-1}$ (characteristic of the base and non-doped form) to about $10^3$ ohm$^{-1}$cm$^{-1}$ upon full doping.

The ring substituted polyaniline, and in particular, the ortho-ethoxy derivatives, and ortho propyl derivatives exhibit appreciably greater solubility than the unsubstituted ones.

The unsubstituted emeraldine base form of polyaniline is soluble in various organic solvents, and in various aqueous acid solutions. Examples of organic solvents are dimethylsulfoxide (DMSO), dimthylformamide (DMF) and N-methylpyrrolidinone (NMP). This list is exemplary only and not limiting. Examples of aqueous acid solutions is 80% acetic acid, and 60–88% formic acid. This list is exemplary only and not limiting. The ring substituted derivatives are also soluble in more solvents, including less polar solvents such as chloroform methylenechloride, xylene and toluene.

Preferred polyaniline compounds in the present invention are ethoxy derivatives, represented by the following:

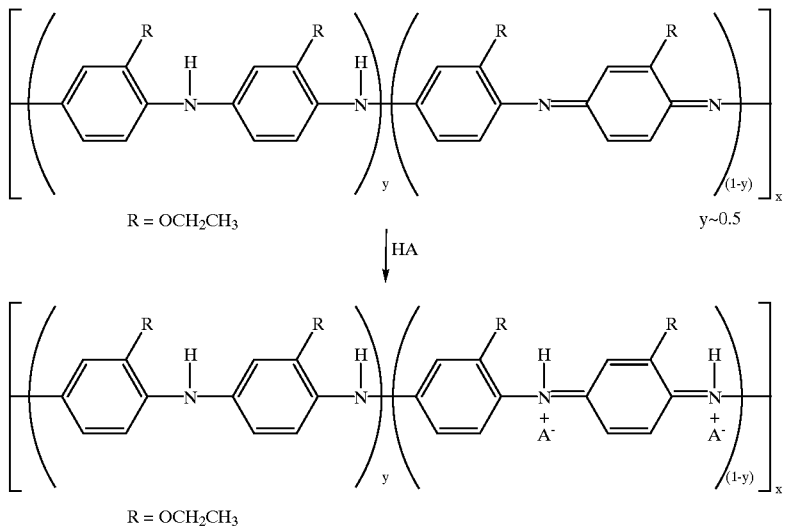

R = OCH$_2$CH$_3$  y~0.5

↓ HA

R = OCH$_2$CH$_3$

The ethoxy substituted polyaniline in the non-doped form (base) can be readily dissolved to a 10% by weight solution in NMP, and spun at various rpms to form films of different thicknesses (184,339 and 477 nm, respectively). Films from this polymer are very homogenous and well adherent. Even the thinnest film behaves as a perfect barrier to oxygen, as electrochemical data show no current normally attributable to oxygen reduction The measured cathodic current of about $2 \times 10^{-7}$ A/cm$^2$ is independent of film thickness, type of metal (copper, silver and platinum) and ambient atmosphere (air and nitrogen). The current is diffusion limited and most likely caused by reduction of ethoxy radical or the ethoxy polymer backbone. The anodic current, metal dissolution, is in all cases greatly reduced by a factor which increases with film thickness. The protection is substantial, in particular at high potentials, where Cu dissolution (and similarly silver dissolution) is about 4 orders of magnitude lower than measured on unprotected metals.

In addition, ethoxy substituted polyaniline spin-doped with acid HA, such as hydrochloric acid, can be prepared by first spin-coating of the polymer in the non-conducting form, and subsequently doping such as by dipping the film into a 1N aqueous hydrochloric acid solution for about 1 hour and then drying. The polymer upon full doping has a conductivity on the order of $10^{-2}$ ohm$^{-1}$cm$^{-1}$. Its corrosion protection is similar to that offered by non-doped ethoxypolyaniline, except for the measurement of the oxygen reduction rate. Apparently, as the polymer is conducting, it allows a passage of electrons needed for oxygen reduction. The protection of the film is excellent, especially at anodic potentials.

Examples of another substituted polyaniline is orthopropyl polyaniline.

The polyanilines, and preferably the alkoxy substituted polyanilines, such as ethoxy substituted polyanilines, as such, both in the non-doped less conducting form and the doped more conducting form, are useful as corrosion protecting layer on a metal substrate. The polyanilines are preferably employed in their conducting doped form.

Examples of suitable polythiophenes are represented by the following formula:

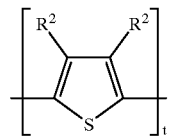

wherein each $R^2$ is H or any organic or inorganic radical; wherein $t \geq 1$ and preferably wherein at least one $R^2$ is not H.

Polyparaphenylenevinylenes useful to practice the present invention have general formula wherein each $R^3$ is H or any organic or inorganic radical, and wherein $s \geq 1$. Each $R^3$ can be the same or different:

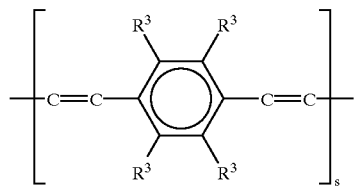

Polyazines useful to practice the present invention have general formula wherein $R^{10}$ is H or an organic or inorganic radical:

—CR$^{10}$=N—N=CR$^{10}$—$_n$ wherein $n \geq 1$

Polyfurans useful to practice the present invention have general formula, wherein $Z \geq 1$ and each $R^4$ is H or any organic radical, and each $R^4$ can be the same or different:

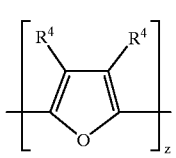

Polypyrroles which are useful to practice the present invention have general formula, wherein $w \geq 1$, each $R^5$ is H or any organic or inorganic radicals; wherein each one $R^5$ can be the same or different:

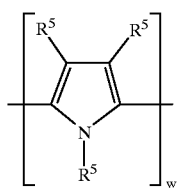

Polyselenophene useful to practice the present invention have general formula, wherein $v \geq 1$, and each $R^6$ is H or any organic or inorganic radical and wherein each $R^6$ can be the same or different:

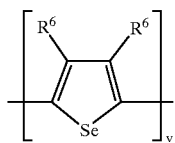

Examples of combinations of polythiophenes, polyfurans, polypyrroles and polyselenophene useful to practice the present invention are represented by the following equations wherein $R^4$, $R^5$ and $R^6$ are as defined above wherein at least two of a, b, c and d are greater than or equal to 1; $m \geq 1$; $Q^1$, $Q^2 Q^3$ can be a vinylene group or a direct bond between adjacent constituents:

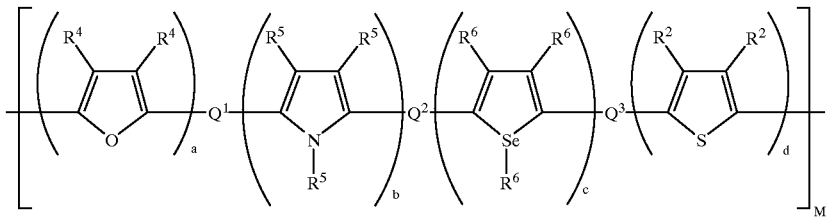

Poly-p-phenylene sulfides useful to practice the present invention are represented by the following general formula wherein each $R^7$ is H or any organic or inorganic radical and $f \geq 1$, each $R^7$ can be the same or different:

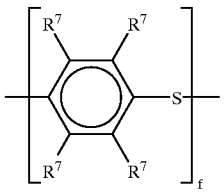

The article entitled *New Routes to Processed Polyacetylenes,* T. Swager, et al. Polymer Preprints, Vol. 30, No. 1, p. 161, April 1989, describes methods of preparing polyacetylene from a soluble precursor, the teaching of which is incorporated herein by reference.

The conductive particles can be precoated with the above conducting polymers prior to admixture with the polymeric matrix. In the alternative, the above conducting polymer and conductive particles can be separately admixed with the polymeric matrix. The blending can be carried out by dispersion or more preferably, by solution blending. When the above defined conducting polymer and conductive particles are admixed with the polymeric matrix, lower amounts of conductive particles are needed to obtain a given conductivity.

When used to precoat the conductive particles, the conducting polymer is generally used to provide coatings about 0.1 to about 5 microns thick, and preferably about 0.15 to about 2.5 microns thick The particles can be solution coated.

The polymeric matrix employed, pursuant to the present invention, can be thermoset or thermoplastic polymeric materials. The preferred polymers are the polyepoxides, polyacrylates, polymethacrylates, polysiloxanes, and polyimides, such as the polyimide siloxanes, polyurethanes, polyolefins, and polyamides. Mixtures of polymers as well as copolymers can be employed when desired.

The composition of the matrix polymer, the conducting polymer and the conducting particles is as follows: The conducting polymer is typically employed in amounts of 0.3 to about 90, and preferably about 0.5 to about 50% by weight, and most preferably about 1 to about 10% by weight based upon the total weight of the polymeric matrix.

The amount of conducting particles is typically about 40% to about 95% by weight, preferably about 75 to about 95% by weight, and most preferably about 80 to about 90% by weight relative to the total polymer content (conducting polymer and matrix polymer).

The compositions of the present invention when used as a corrosion prevention layer are typically employed at thicknesses of about 500 Å to about 5 μm, and preferably about 1000 Å to about 5000 Å. The substrates employed are typically copper and silver.

The compositions of the present invention can be used to bond together a semiconductor with a substrate as a replacement for solder interconnections.

The compositions of the present invention are useful as electromagnetic interference (EMI) coatings on a dielectric surface. For example, electrical components are frequently contained within dielectric housings, such as cabinets, molded plastics and the like. To reduce the susceptibility of the electronic components contained within the housing to electromagnetic radiation, the dielectric housing can be coated with the compositions of the present invention The following non-limiting examples are presented to further illustrate the present invention:

EXAMPLE 1

Preparation of Polyanilines

Polyaniline (unsubstituted) was prepared by the chemical oxidative polymerization of aniline in aqueous/1 normal hydrochloric acid using ammonium persulfate as the oxidant. The conducting polyaniline hydrochloride salt is isolated from the reaction mass. The HCl salt is converted to the polyaniline base form (non-conducting) by reacting with 0.1M $NH_4OH$. The isolated polyaniline base can then be doped with the desirable acid or alkylating agent to give a conducting derivative.

The substituted polyaniline derivatives were prepared by the oxidative polymerization of the appropriate ring-substituted aniline manomer along the lines of the method described. For example, the ethoxy-substituted polyaniline was prepared by the oxidative polymerization of o-phenetidine. The ethoxy-polyaniline hydrochloride salt and base form were isolated as described above.

The conducting ethoxy polyaniline doped with toluene sulphonic acid was prepared by reacting the ethoxy polyaniline base powder heterogeneously with 1 normal aqueous toluenesulfonic acid. It can also be prepared by reacting a solution of ethoxy-polyaniline base in NMP or gamma-butyrolactone with toluenesulfonic acid.

Alternatively, o-phenetidine can be polymerized in the presence of aqueous 1 normal toluene sulfonic acid instead of hydrochloric acid to yield the conducting ethoxy polyaniline tosylate.

The ethoxy-polyaniline tosylate is dissolved in NMP (N-methyl pyrrolidinone) or gamma-butyrolactone to prepare 6 weight % solutions.

EXAMPLE 2

Preparation of Coated Silver Particles

An Ethoxy polyaniline tosylate solution prepared in Example 1 was added to the silver particles. The particles were stirred in the conducting solution. The particles were then filtered and dried under vacuum.

EXAMPLE 3

Preparation of Conductive Composition

A conductive paste is made by combining the polyaniline coated silver powder of Example 2 with the host polymer, such as polymethylmethacrylate in an appropriate solvent system, such as xylene. The solvent is chosen so as not to dissolve the polyaniline. The materials are blended by a dispersion technique or high shear mixing.

EXAMPLE 4

Blending of a Host Polymer and Polyaniline and Metal Fillers

To a host resin, in particular, polymethylmethacrylate in gamma-butrolactone was added a gamma-butrolactone solution of the ethoxy polyaniline tosylate. The two polymers mixed well. To the polymer blend solution were added silver particles, by dispersion mixing. The resulting mixture was used to spin-coat conducting coatings. The mixture can also be processed by conventional means to fabricate conducting films or composites suitable for the uses disclosed above.

EXAMPLE 5

Corrosion was measured in two complementary ways. The first water drop test 1 uses an electrochemical technique described as follows:

Evaluation of the corrosion rate by electrochemical techniques is direct and precise, but not readily applicable to conditions of atmospheric corrosion. Tests were conducted in a miniature cell, that was designed in an attempt to bridge the benefits of electrochemical testing and the challenges presented by corrosion reactions under a thin layer of an electrolyte. The cell can use a droplet of water as an electrolyte, as described by Brusic, et al., J. Electrochem. Soc., 136 42 (1989).

The set-up consists of the sample (working electrode) masked with plating tape to expose a 0.32 cm$^2$ area. Pt mesh (counter electrode), and a mercurous sulfate electrode (reference electrode), with a filter paper disk separating each electrode. The procedure was as follows: The metallic sample, with or without polyaniline coating, was placed on a small jack, and the working area, covered with a tightly fitted filter paper and a flat Pt mesh, was maneuvered into a center of the opening of a vertically positioned and a rigidly held Beckmann fitting. The inner diameter of the fitting was 8 mm, i.e., large enough to easily expose the entire working area that has a diameter of 6.4 mm. The sample was then raised and kept in place at a hand-tight pressure against the fitting. The second filter disk was an Eppendorf pipette, and the reference electrode was positioned over the sample using the fitting as a holder. A typical droplet size was 20 $\mu$l. Due to small distances between the electrodes, the ohmic resistance in the cell was relatively small even with electrolytes such as deionized and triple-distilled water. As the ohmic resistance of the cell was only about 800 in the first seconds of measurement, insignificant errors in the evaluation of corrosion rates are introduced. The procedure was to monitor the corrosion potential for about 15 minutes and periodically measure the polarization resistance by scanning the potential ±20 mV from the corrosion potential at 1 m V/s. The corrosion rate was calculated using the Model 352 SoftCorr II software by AG&G Princeton Applied Research. The potentiodynamic polarization curve was then measured at a rate of 1 mV/s from 0.25 V cathodic of the corrosion potential. The corrosion rate was evaluated by an extrapolation of the cathodic and anodic currents to the corrosion potential.

Excellent corrosion protection has been measured with unsubstituted, undoped polyaniline base, FIG. 1 (curve 3). The film was processed from a 5% solution in NMP, and baked after spin-drying at 80° C. for 4 minutes. Its conductivity is low, $10^{-10}$ ohm$^{-1}$cm$^{-1}$, and thermal stability is up to >400° C. The film adheres well to the metal surface and acts as a barrier to all corrosion reactions. Potentiodynamic current-potential curve looks similar to one obtained on unprotected copper, but the corrosion current is lower and the corrosion potential higher for copper covered with this film. This indicates that the film also affects exodus of copper ions, i.e., the anodic reaction.

The surprisingly effective protection is observed with ethoxy substituted non-doped polyaniline base, FIG. 1 (curve 1). This polymer is applied from a 10% solution in NMP, and spun at various rpms to form films of different thicknesses (184, 339 and 477 nm, respectively). The films are very homogenous and well adherent. Even the thinnest film behaved as a perfect barrier to oxygen, as electrochemical data show no current normally attributable to oxygen reduction. The measured cathodic current of about $2\times10^{-7}$ A/cm$^2$ is independent of film thickness, type of metal (copper, silver and platinum tested) and ambient atmosphere (air and nitrogen tested). The current is diffusion limited and most likely caused by reduction of ethoxy radical or the ethoxy polymer backbone. The anodic current, metal dissolution, is in all cases greatly reduced by a factor which increases with film thickness. The protection is substantial, in particular at high potentials, where Cu dissolution (and similarly silver dissolution) is about 4 orders of magnitude lower than measured on unprotected metals.

Ethoxy substituted polyaniline doped with hydrochloric acid was prepared by spin-drying the non-doped ethoxy base polyaniline and then doping by dipping into 1N hydrochloric acid. The doped polymer has a conductivity on the order of $10^{-2}$ ohm$^{-1}$cm$^{-1}$. Its corrosion protection is similar to the one offered by the non-doped ethoxy-polyaniline base, except for the measurement of the oxygen reduction rate. Since the doped polymer is more highly conducting, it allows a passage of electrons needed for oxygen reduction. The protection of the film is excellent, especially at anodic potentials.

The second method:
Water Drop Test II:

A drop of water is placed across adjacent metal leads. A potential of 5V is then applied across the metal lines and failure or time for dendrite formation is measured. The time is given from the time the voltage was applied until shorting between the lines is observed.

Test vehicle for measurement:

Test vehicle: Cu lines applied by evaporation on 0.5 μm SiO2 coated wafers. Copper line patterns include: 1) line width—8 mils spacing—16 mils 2) line width—6 miles spacing 12 mils.

Bare Copper (Cu)

The copper lines were cleaned with a 15% acetic acid solution to remove native oxides, rinsed with deionized water and dried. Results are as follows:
3 repeated test measurements:

16 mils spacings—45 seconds, 48 secs, 51 secs for dendrites to form 12 mils spacings—39 seconds, 42 secs, 40 secs for dendrite to form

Copper Lines Treated with Benzotriazole (BTA) Solution

Copper was dipped in 15% acetic acid, rinsed with DI water; while the copper was still wet, it is dipped in mildly alkaline KOH solution (pH=10) for 10 minutes. This results in formation of $Cu_2O$ (about 2 nm thick). This is followed by a water rinse. The sample is then dipped into a BTA solution for 10 minutes (1 g BTA/1 liter $H_2O$), rinsed and dried.

For both copper and silver lines (same width and spacings) immediate dendrite formation occurred with the water drop test for both bare surfaces and BTA coated surfaces.

Ethoxy Polyaniline (Base or Non-Conducting Form)

A 10% weight solution in NMP of the ethoxy polyaniline base was used to spin-coat films on wafers with copper and silver lines (as described above). Spinning at 3000 rpm/30s and softbaking 85° C. for 5 minutes resulted in a 5159 Å thick film.

Water Drop Test After 220° C./30 Minutes Storage

Copper and silver lines with the 5159 Å ethoxy-polyaniline film did not form any dendrite, even after 30 minutes (water drop test).

Temperature and Humidity Test (85° C. 80% Relative Humidity)

The 5159 Å thick film of the ethoxy non-doped polyaniline base coated silver and copper surfaces were tested under the above temperature and humidity conditions. Test results for both silver and copper show that after 1076 hours storage at the above T:H conditions, no dendrites formed even after 30 minutes in the Water Drop II Test. This is both for the 12 mils and 16 mils lines.

Temperature/Humidity/Bias Voltage Test

Leakage current is continually monitored and failure is flagged when the isolation resistance reading between the 2 lines is less than 16 mega-ohms. Test is done while wafer is in the oven at 85° C. and 80% relative humidity. The copper and silver line pattern used were a) 8 mils wide 16 mils spacings and b) 6 mils wide 12 mils spacings. The applied voltage was 3 volts and 14.99 volts. The polyaniline coated wafers passed 500 hours and 1000 hours.

Ethoxy Polyaniline Doped with Hydrochloric Acid (More Highly Conducting Form of Polymer a. thickness of the coating was 5000 Å Room temperature water drop test results: No dendrite formation even after 30 minutes (similarly to the base form) Example 5.

b. Temperature/humidity storage (85° C. for 1016 hours) Water drop test results showed no dendrite formation even after 30 minutes test.

What is claimed is:

1. A method for providing electrostatic discharge protection by applying a composition comprising a thermoset or thermoplastic polymeric matrix, and a conductive filler component, where said filler component comprises electrically conductive particles and at least one conducting polymer selected from the group consisting of substituted and unsubstituted polyparaphenylenevinylenes, substituted and unsubstituted polyanilines, substituted and unsubstituted polyazines, substituted and unsubstituted polythiophenes, substituted and unsubstituted polyparaphenylenes, substituted and unsubstituted poly-p-phenylene sulfides, substituted and unsubstituted polyfuranes, substituted and unsubstituted polypyrroles, substituted and unsubstituted polyselenophenes, substituted and unsubstituted polyacetylenes, mixtures thereof, and copolymers thereof to a dielectric substrate.

2. The method of claim 1 wherein the amount of said conducting polymer is about 0.3 to about 90% by weight of the total of said polymeric matrix.

3. The method of claim 2 wherein the amount of conductive particles is about 40 to about 95% by weight based upon the total of said conducting polymer and said polymeric matrix.

4. The method of claim 2 wherein the amount of conducting particles is about 80 to about 90% by weight based upon the total of the conducting polymer and the polymeric matrix.

5. The method of claim 1 wherein said polymeric matrix comprises at least one polymer selected from the group consisting of polyepoxides, polyacrylates, polysiloxanes and polyimides, polymethacrylates, polyurethanes, polyolefins, and polyamides.

6. The method of claim 1 wherein said particles are carbon.

7. The method of claim 1 wherein said particles are precoated with said conducting polymer.

8. The method of claim 1 wherein said polymer is a polyaniline.

9. The method of claim 1 wherein said composition is in the form of a paste.

10. The method of claim 9 wherein said polyaniline is an alkoxy substituted polyaniline.

11. The method of claim 1 wherein said conducting polymer has conductivity of about $10^{-10}$ ohm$^{-1}$cm$^{-1}$ to about $10^6$ ohm$^{-1}$cm$^{-1}$.

12. The method of claim 1 wherein said conducting polymer is unsubstituted.

13. The method of claim 1 wherein said conducting polymer is substituted with at least one member selected from the group consisting of alkyl, aryl, alkoxy, aryloxy, alkaryl, aralkyl, Si and Ge.

14. The method of claim 13 wherein said member contains 1–12 carbon atoms.

15. The method of claim 1 wherein the amount of conductive particles is about 75 to about 95% by weight based upon the total of the conducting polymer and the polymeric matrix.

16. The method of claim 15 wherein the amount of the conducting polymer is about 0.5 to about 50% by weight of the total of the polymeric matrix.

17. The method of claim 15 wherein the amount of the conducting polymer is about 1 to about 10% by weight based upon the total weight of the polymeric matrix.

18. The method of claim 1 wherein the composition is obtained by separately admixing the conducting polymer and the conductive particles with the polymeric matrix.

19. A method of providing electromagnetic interference shielding by applying a composition comprising a thermoset or thermoplastic polymeric matrix, and a conductive filler component, where said filler component comprises electrically conductive particles and at least one conducting polymer selected from the group consisting of substituted and unsubstituted polyparaphenylenevinylenes, substituted and unsubstituted polyanilines, substituted and unsubstituted polyazines, substituted and unsubstituted polythiophenes, substituted and unsubstituted polyparaphenylenes, substituted and unsubstituted poly-p-phenylene sulfides, substituted and unsubstituted polyfuranes, substituted and unsubstituted polypyrroles, substituted and unsubstituted polyselenophenes, substituted and unsubstituted polyacetylenes, mixtures thereof, and copolymers thereof to a dielectric substrate.

20. The method of claim 19 wherein the amount of said conducting polymer is about 0.3 to about 90% by weight of the total of said polymeric matrix.

21. The method of claim 20 wherein the amount of conductive particles is about 40 to about 95% by weight based upon the total of said conducting polymer and said polymeric matrix.

22. The method of claim 20 wherein the amount of conducting particles is about 80 to about 90% by weight based upon the total of the conducting polymer and the polymeric matrix.

23. The method of claim 19 wherein said polymeric matrix comprises at least one polymer selected from the group consisting of polyepoxides, polyacrylates, polysiloxanes and polyimides, polymethacrylates, polyurethanes, polyolefins, and polyamides.

24. The method of claim 19 wherein said particles are carbon.

25. The method of claim 19 wherein said particles are precoated with said conducting polymer.

26. The method of claim 19 wherein said polymer is a polyaniline.

27. The method of claim 26 wherein said polyaniline is an alkoxy substituted polyaniline.

28. The method of claim 19 wherein said composition is in the form of a paste.

29. The method of claim 19 wherein said conducting polymer has conductivity of about $10^{-10}$ ohm$^{-1}$cm$^{-1}$ to about $10^6$ ohm$^{-1}$cm$^{-1}$.

30. The method of claim 19 wherein said conducting polymer is unsubstituted.

31. The method of claim 19 wherein said conducting polymer is substituted with at least one member selected from the group consisting of alkyl, aryl, alkoxy, aryloxy, alkaryl, aralkyl, Si and Ge.

32. The method of claim 31 wherein said member contains 1–12 carbon atoms.

33. The method of claim 19 wherein the amount of conductive particles is about 75 to about 95% by weight based upon the total of the conducting polymer and the polymeric matrix.

34. The method of claim 33 wherein the amount of the conducting polymer is about 0.5 to about 50% by weight of the total of the polymeric matrix.

35. The method of claim 33 wherein the amount of the conducting polymer is about 1 to about 10% by weight based upon the total weight of the polymeric matrix.

36. The method of claim 19 wherein the composition is obtained by separately admixing the conducting polymer and the conductive particles with the polymeric matrix.

* * * * *